(12) United States Patent
Zhang

(10) Patent No.: US 6,816,554 B1
(45) Date of Patent: Nov. 9, 2004

(54) COMMUNICATION BUS FOR LOW VOLTAGE SWING DATA SIGNALS

(75) Inventor: Kevin X. Zhang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/351,367

(22) Filed: Jul. 12, 1999

(51) Int. Cl.[7] .......................... H04L 25/00; G01R 19/00
(52) U.S. Cl. ........................................ 375/257; 327/52
(58) Field of Search ............................. 326/30, 56, 83, 326/86, 101, 114, 115; 333/124; 327/89, 57, 158–161, 541; 375/257, 354, 357; 703/27; 710/104; 711/154, 168; 712/43

(56) References Cited

U.S. PATENT DOCUMENTS

| | | | |
|---|---|---|---|
| 4,123,799 A | 10/1978 | Peterson | |
| 4,204,277 A | * 5/1980 | Kinoshita | 327/57 |
| 4,247,791 A | 1/1981 | Rovell | |
| 4,561,702 A | 12/1985 | McAdams | |
| 4,751,681 A | 6/1988 | Hashimoto | |
| 4,831,287 A | 5/1989 | Golab | |
| 5,144,168 A | 9/1992 | Tran | |
| 5,148,063 A | * 9/1992 | Hotta | 327/56 |
| 5,638,402 A | * 6/1997 | Osaka et al. | 375/257 |
| 5,650,971 A | 7/1997 | Longway et al. | |
| 5,654,918 A | * 8/1997 | Hammick | 365/185.2 |
| 5,668,765 A | 9/1997 | Ang | |
| 5,699,304 A | 12/1997 | Jung et al. | |
| 5,726,942 A | 3/1998 | Yoneda et al. | |
| 5,764,572 A | * 6/1998 | Hammick | 365/185.33 |
| 5,796,273 A | 8/1998 | Jung et al. | |
| 5,821,792 A | 10/1998 | Miwa | |
| 5,834,953 A | 11/1998 | Glass et al. | |
| 5,850,359 A | 12/1998 | Liu | |
| 5,907,251 A | * 5/1999 | Houghton | 370/294 |
| 5,920,218 A | 7/1999 | Klass et al. | |
| 5,936,953 A | * 8/1999 | Simmons | 377/47 |
| 6,028,454 A | 2/2000 | Elmasry et al. | |
| 6,137,319 A | 10/2000 | Krishnamurthy et al. | |
| 6,154,498 A | * 11/2000 | Dabral et al. | 375/257 |
| 6,198,682 B1 | * 3/2001 | Proebsting | 365/207 |
| 6,278,740 B1 | * 8/2001 | Nordyke | 375/257 |
| 6,414,520 B1 | * 7/2002 | Dupcak et al. | 327/52 |
| 6,697,896 B1 | * 2/2004 | Chen | 710/100 |

OTHER PUBLICATIONS

Samurai et al, "Low–Power CMS Design through $V_{th}$ Control and Low–Swing Circuits", 1997 International Symposium on Low Power Electronics and Design, Aug. 18–20, 1997, Monterey, California; Association for Computing Machinery, New York, New York.

* cited by examiner

*Primary Examiner*—Stephen Chin
*Assistant Examiner*—Lawrence Williams
(74) *Attorney, Agent, or Firm*—Kenyon & Kenyon

(57) ABSTRACT

In an integrated circuit, a low voltage swing logic communication bus has N+2 data wires for N data signals. Each of the N data signals is carried on its own wire. The communication bus includes two other reference signals.

51 Claims, 3 Drawing Sheets

100

200

500

700

COMMUNICATION BUS FOR LOW VOLTAGE SWING DATA SIGNALS

BACKGROUND OF THE INVENTION

The present invention relates to an improved communication bus for use in integrated circuits based on low voltage swing logic.

Low voltage swing ("LVS") circuits are known per se. Systems built upon such circuits typically carry data on a pair of wires. A first wire carries a true value of the data signal (D) and a second wire carries a complementary value of the data signal (D#). During a precharge phase, both the wires are precharged to a predetermined potential. During an evaluation phase, the potentials on the two wires diverge in response to the information content of the data signal. The LVS circuit generates an output response to voltage differences between the true and complementary signals.

LVS circuits are advantageous because they achieve higher data throughput than conventional "full swing" logic circuit. In a "full swing" circuit, a data signal typically transitions completely to either ground or $V_{cc}$ before the circuit can generate an output signal. Because an LVS circuit can sense data from small voltage differences, LVS circuits realize faster operation and improved throughput than conventional full swing logic circuits. Further, because full swing transitions are not necessary to detect useful data, the voltages used within an LVS integrated circuit are reduced over a corresponding full swing circuit, thereby contributing to reduced power consumption.

Because each data signal is carried through the LVS circuit on a pair of wires, LVS circuits include twice as many metal tracks or wires between circuit elements than are in a corresponding full swing circuit. Although the metal pitch may be made tighter in an LVS circuit because of the reduced voltages, the doubling of wires in an LVS integrated circuit can lead to wiring congestion in the circuit. Such disadvantages can limit the applications for which circuit designers may choose to use LVS circuits.

Accordingly, there is a need in the art for an integrated circuit that possesses the speed and throughput advantages of LVS circuits but that also do not suffer the corresponding disadvantages of wiring congestion.

SUMMARY

Embodiments of the present invention provide a communication bus for low voltage swing data signals that includes a wire for each of the low voltage swing logic data signals and a pair of wires for two reference signals.

DETAILED DESCRIPTION

Embodiments of the present invention provide a communication bus and sense amplifier for low voltage swing logic applications having reduced wiring congestion than is found in the prior art. Specifically, data is carried over the communication bus in only one state, the true state. The bus also carries dummy reference signals that used for comparison against all the data signals. Thus, the communication bus alleviates wiring congestion that may be found in other designs.

Figure 1:
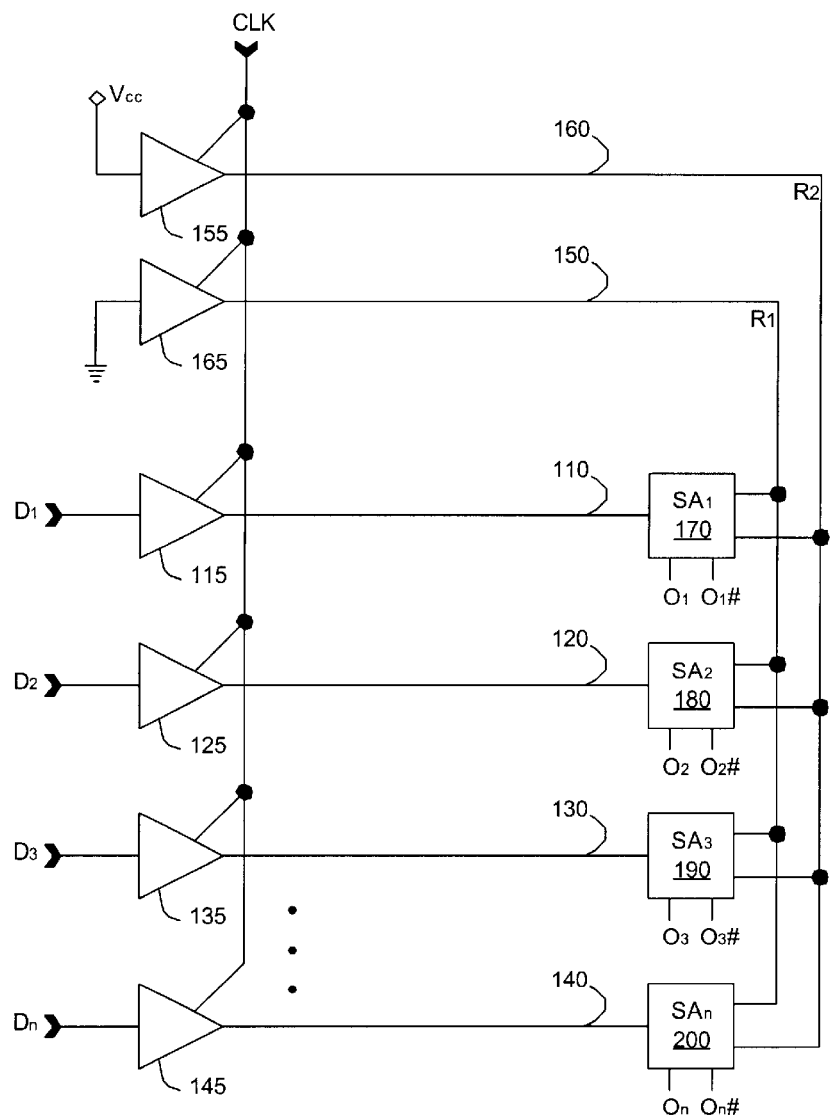
FIG. 1 is a block diagram illustrating a communication bus according to an embodiment of the present invention.

FIG. 1 illustrates a communication bus 100 according to an embodiment of the present invention for use in an integrated circuit. As illustrated, the bus 100 carries data for N data signals on N+2 wires. The bus 100 includes a first set of N data wires 110–140, one for each of the N data signals $D_1$–$D_N$. The bus 100 also includes a N+$1^{st}$ wire 150 for a first reference signal, $R_1$ and an N+$2^{nd}$ wire 160 for a second reference signal $R_2$. Signals are generated on each of the bus wires 110–160 by a respective driver circuit 115–165. Each of the data wires 110–140 terminate in a respective sense amplifier circuit 170–200. The first and second reference wires 150, 160 terminate in each of the sense amplifier circuits 170–200.

Embodiments of the communication bus 100 may find application in a domino system in which signals such as data signal $D_1$ transition through a precharge phase and an evaluation phase on each clock cycle. During a precharge phase, each signal $D_1$–$D_N$ is maintained at a precharge potential (such as $V_{cc}$). The signals do not carry any information content during the precharge phase. During an evaluation phase, depending upon its information content, each signal may transition from the precharge potential toward the evaluation potential. In an LVS circuit employing domino techniques, the signal typically would make a partial transition toward the evaluation potential, not a complete transition as would occur in full swing circuits.

According to an embodiment of the present invention, the reference signals $R_1$, $R_2$ may be "dummy" domino signals. Although they precharge in a manner that is consistent with true domino signals, their behavior during the evaluation phase is predetermined. The first reference signal $R_1$, does not evaluate; it remains at the precharge potential during both the precharge phase and the evaluation phase. The second reference signal $R_2$ always evaluates; it transitions toward the evaluation potential during the evaluation phase.

Figure 2:
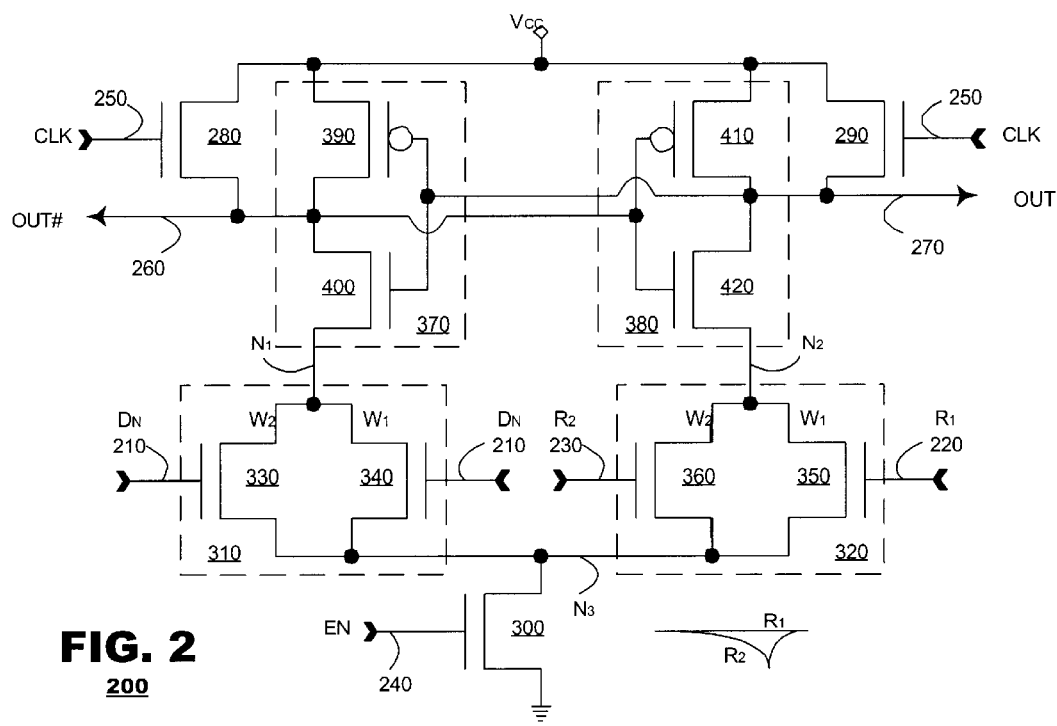
FIG. 2 is a circuit diagram illustrating a sense amplifier according to an embodiment of the present invention.

FIG. 2 illustrates a sense amplifier 200 constructed according to an embodiment of the present invention. The sense amplifier 200 may be populated by a plurality of input terminals 210, 230 for input of a data signal $D_N$ and a pair of reference signals $R_1$ and $R_2$ respectively. The sense amplifier 200 also may include additional input terminals 240, 250 for the application of respective enabling and clocking signals. Further, the sense amplifier 200 may include output terminals 260, 270 for the output of differential output signals OUT$_N$# and OUT$_N$.

The embodiment of the sense amplifier 200 may include a pair of precharge transistors 280, 290 each of which couples a respective output terminal 260, 270 to a precharge potential. In the exemplary embodiment illustrated in FIG. 2, the precharge transistors 280, 290 are shown coupled to $V_{cc}$. Gates of the precharge transistors 280, 290 are coupled to the input terminal 250 for the clock signal. The sense amplifier 200 may include an enabling transistor 300 coupled to an evaluation potential, shown as ground in the example of FIG. 2.

The sense amplifier 200 may be populated by an evaluation circuit 310 and a reference circuit 320. The evaluation circuit 310 bridges an intermediate node $N_1$ in the sense amplifier 200 to ground via the enabling transistor 300. The evaluation circuit 310 may include a pair of data transistors 330, 340 providing parallel paths from node $N_1$ to the enabling transistor 300. Gates of each data transistor 330, 340 of the evaluation circuit 310 may be coupled to the input terminal 210 for the data signal $D_N$.

A reference circuit 320 may couple a second intermediate node $N_2$ to the enabling transistor 320. The reference circuit 320 also may include a pair of transistors 350, 360 providing paths from node $N_1$ to the enabling transistor 300. A gate of a first transistor of the reference circuit 320 may be coupled to an input terminal 220 corresponding to the $R_1$ signal. A gate of a second transistor of the reference circuit 320 may be coupled to an input terminal 230 of the $R_2$ signal.

The sense amplifier 200 also may be provided with a pair of clamping circuits 370, 380, one provided in association with each of the output terminals 260, 270. A first clamping circuit 370 may include a pair of transistors 390, 400 each coupled to the output terminal 260 for the $OUT_N\#$ signal. A first transistor 390 bridges the output terminal 260 to the precharge potential (e.g. $V_{cc}$). A second transistor 400 couples the output terminal 260 to the evaluation circuit 310. Gates of the first and second transistors 390, 400 are connected to the output terminal 270 associated with the $OUT_N$ signal.

The second clamping circuit 380 also may include a pair of transistors 410, 420 each coupled to the output terminal 270 associated with the $OUT_N$ signal. The first transistor 410 bridges the output terminal 270 to a precharge potential. The second transistor 420 couples the output terminal 270 to the reference circuit 320. Gates of the first and second transistors 410, 420 are connected to the output terminal 260 associated with the $OUT_N\#$ signal.

The embodiment of FIG. 2 as illustrated is a "precharge high, evaluate low" circuit; the precharge potential is at $V_{cc}$ and the evaluation potential is ground. The data transistors 330, 340, the reference transistors 350, 360 the clamping transistors 400, 420 and the precharge transistors 280, 290 may be selected to be of a type that is conductive in response to the precharge potential. For example, in the "precharge high" embodiment of FIG. 2, the transistors 280, 290, 330–360, 400 and 420 may be NMOS transistors. Additionally, the clamping transistors 390, 410 may be selected to be of a type that is conductive in response to the evaluation potential. For example, in the "evaluate low" embodiment of FIG. 2 the transistors 390, 410 may be PMOS transistors.

Consider operation of the sense amplifier 200 in the context of the dummy domino signals $R_1$ and $R_2$. During the precharge phase, the enable signal is low rendering the enable transistor 300 nonconductive. The clock signal is high, rendering the clocking transistors 280, 290 conductive. Further, the data signal $D_N$ and the two reference signals $R_1$, $R_2$ are precharged high, rendering transistors 330–360 conductive. Because the output terminals 260, 270 are precharged, the second transistors 400, 420 of the two clamping circuits 370, 380 are conductive. Thus, intermediate nodes $N_1$ and $N_2$ are precharged to $V_{cc}$. Further, because the data transistors 330–360 all are conductive, node $N_3$, the source of the enable transistor 300, also is precharged.

During the evaluation phase, the enable transistor 300 becomes conductive and node $N_3$ discharges to ground. In the reference circuit 320, the $R_2$ signal begins to transition toward the evaluation potential, rendering reference transistor 360 increasingly less conductive. However, the $R_1$ signal remains at the precharge potential and the reference transistor 350 remains strongly conductive node $N_2$ begins to discharge through transistor 350.

In evaluation circuit 310, the data signal $D_N$ may or may not evaluate depending upon the information content of the signal. If the data signal $D_N$ does not evaluate, it remains at the precharge potential. Both data transistors 330, 340 remain strongly conductive. In this event, node $N_1$ discharges to ground through both transistors. Node $N_1$ discharges quickly through the two transistors 330, 340 as compared to node $N_2$. If the data signal $D_N$ does evaluate, both data transistors 330, 340 become increasingly less conductive. The node $N_1$ discharges slowly relative to node $N_2$.

As shown above, during the evaluation phase, the two data transistors 330, 340 of the evaluation circuit 310 operate in unison; they either remain conductive or become non-conductive. By contrast, the data transistors 350, 360 of the reference circuit 320 never operate in unison; one transistor 350 always remains conductive and the other transistor 360 always becomes non-conductive during the evaluation phase. According to an embodiment of the present invention, this difference in operation achieves timing differences in the discharge rates of the nodes $N_1$, $N_2$. If the data signal $D_N$ evaluates, node $N_2$ discharges faster than node $N_1$; if not, node $N_2$ discharges more slowly than node $N_1$.

At the beginning of the evaluation phase, the two NMOS transistors 400, 420 of the clamping circuits 370, 380 are conductive. Thus, the output terminals 260, 270 discharge at the same rate as nodes $N_1$ and $N_2$ respectively. As an output terminal (say, $OUT_N\#$ terminal 260) discharges, the second transistor 410 of the second clamping circuit 380 associated with the second output terminal 270 becomes increasingly less conductive, slowing the rate of discharge of the second output terminal 270. Further, the first transistor 410 of the second clamping circuit 380 becomes conductive which causes the output terminal 270 to charge to the precharge potential. Thus, as a first output terminal discharge 260, it tends to causes the second output terminal 270 to be charged.

Eventually, during the evaluation phase, the discharging effect of one of the nodes $N_1$, $N_2$ becomes dominant. One of the output terminals 260 evaluates and the other terminal 270 is prevented from evaluating by their respective clamping circuits 370, 380.

As is known, transistors for use in integrated circuits may be "weighted" (or "sized"). That is, a first transistor may possess a different weight than a second transistor. Differences in weights cause different transistors to behave differently in terms of the rate at which they cause terminals to charge or discharge. However, it is difficult to manufacture integrated circuits having precise weights in individual transistors.

According to an embodiment of the invention, the data transistors 330–360 may be weighted devices. A first transistor 330, 350 in the evaluation circuit 310 and the reference circuit 320 has a first weight (labeled $W_1$) and a second transistor 340, 360 of the evaluation circuit 310 and the reference circuit 320 has a second weight (labeled $W_2$). The weight ratio of $W_1$ to $W_2$ affects the rates at which nodes $N_1$ and $N_2$ may discharge. According to an embodiment, weight $W_2$ is selected to provide a relatively slower discharge path than $W_1$. In such an embodiment, if the data signal $D_N$ were to evaluate, node $N_1$ would discharge primarily through transistor 340 (a $W_1$ transistor) while node $N_2$ would discharge through transistor 360 (a slower $W_2$ transistor). Node $N_1$ would quickly become a dominant node in this event.

Alternatively, if the data signal $D_N$ does not evaluate, node $N_1$ would not discharge at all and node $N_2$ would discharge through transistor 360. Node $N_2$ would become the dominant discharging node.

Although an embodiment of the sense amplifier 200 may include weighted transistors that, ordinarily, are difficult to manufacture the architecture of the sense amplifier 200 provides an advantage that is not realized in other designs. The typical difficulties of manufacture are ameliorated because the evaluation circuit 310 and the reference circuit 320 possess a mutually symmetrical architecture. When the design of the present invention is manufactured, it will be important to control the weight ratios of the various weighted transistors 330–360 rather than the magnitudes of the weights themselves. Accordingly, the sense amplifier 200 provides advantages in that it provides relaxed tolerances for the manufacture of sense amplifiers 200 having weighted transistors.

Figure 3:
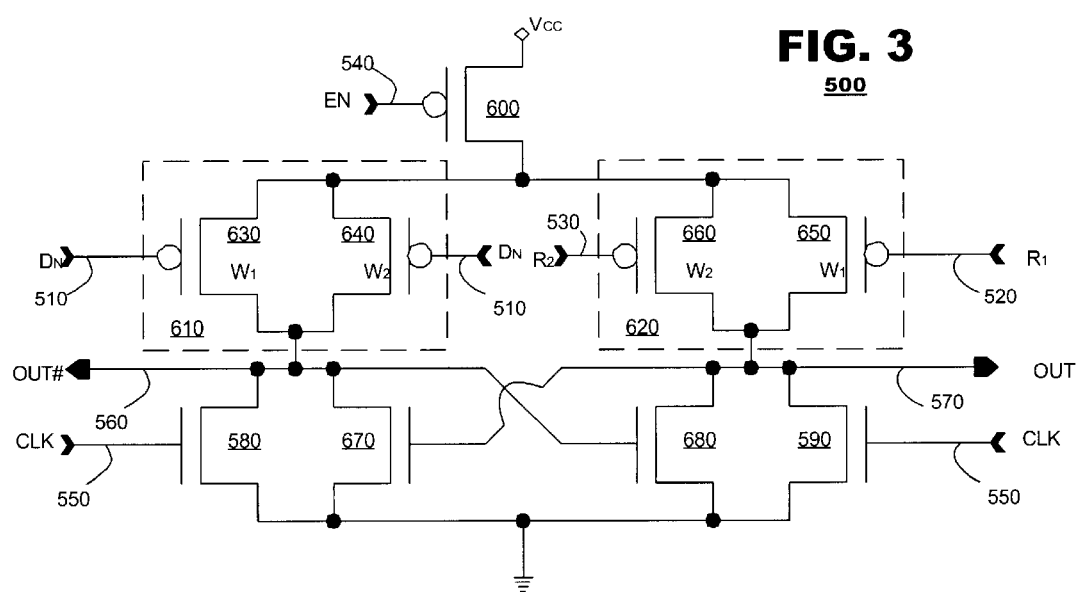
FIG. 3 illustrates a sense amplifier according to an embodiment of the present invention.

FIG. 3 illustrates a sense amplifier 500 constructed in accordance with another embodiment of the present invention. The sense amplifier 500 is populated with input terminals 510–530 for input of respective data signal $D_N$ and reference signals $R_1$ and $R_2$. The sense amplifier 500 also may include input terminals 540, 550 for enable and clock signals. Further, the sense amplifier 500 may include output terminals 560, 570 for output signals $OUT_N\#$ and $OUT_N$.

This sense amplifier 500 of FIG. 3 illustrates an embodiment that may be applied in a "precharge low, enable high" system. That is, the precharge potential in this second embodiment may be ground (0 volts) and the evaluation potential may be $V_{cc}$. Again, the sense amplifier 500 may be used in an LVS system; evaluating signals may transition toward $V_{cc}$ but typically will not complete a full transition before the sense amplifier 500 outputs valid data.

The sense amplifier 500 may include precharge transistors 580, 590 coupling the respective output terminals 560, 570 to ground. The precharge transistors 580, 590 each may include gates that are coupled to the input terminal 550 associated with the clock signal.

The sense amplifier 500 may include an enabling transistor 600 coupled to the evaluation potential. A gate of the enabling transistor 600 may be coupled to the input terminal 540 associated with the enable signal.

The sense amplifier 500 may include an evaluation circuit 610 and a reference circuit 620. The evaluation circuit 610 may couple the $OUT_N\#$ output terminal 560 to the enable transistor 600. The evaluation circuit may include a pair of data transistors 630, 640 providing parallel charging paths from the enabling transistor 600 to the $OUT_N\#$ output terminal 560. Gates of the evaluation circuit may be coupled to the input terminal 510 associated with the $D_N$ data signal.

The reference circuit 620 may couple the enable transistor 600 to the $OUT_N$ output terminal 570. The reference circuit 620 may include a pair of transistors 650, 660 providing parallel charging paths from the enabling transistor 600 to the $OUT_N\#$ output terminal 570. A gate of a first reference transistor 650 is coupled to an input terminal associated with the $R_1$ reference signal. A gate of a second reference transistor 660 is coupled to an input terminal associated with the $R_2$ reference signal.

The sense amplifier 500 also may include a pair of clamping transistors 670, 680. The first clamping transistor 670 couples the $OUT_N\#$ output terminal 560 to the precharge potential, ground A gate of the first clamping transistor 670 is coupled to the $OUT_N$ output terminal 570. The second clamping transistor 680 couples the $OUT_N$ output terminal 570 to the precharge potential, ground A gate of the second clamping transistor 680 is coupled to the $OUT_N\#$ output terminal 560.

The precharge transistors 580, 590, the data transistors 630, 640, and the reference transistors 650, 660 may be selected to be of a type that is conductive in response to the precharge potential. In the "precharge low" embodiment of FIG. 3, the transistors 580, 590, 630–660 may be PMOS transistors. The clamping transistors 670, 680 may be selected to be of a type that is conductive in response to the evaluation potential. In the "evaluate high" embodiment of FIG. 3, the transistors 670, 680 may be NMOS transistors.

Consider operation of the sense amplifier 500 in the "precharge low, enable high" embodiment. During the precharge phase, the enable signal is high rendering the enable transistor 600 nonconductive. The clock signal is at the precharge potential, rendering the clocking transistors 580, 590 conductive. The output terminals 560, 570 are precharged low. Because the output terminals 560, 570 are precharged low, the clamping transistors 670, 680 are conductive. Further, the data signal $D_N$ and the two reference signals $R_1$, $R_2$ are precharged low, rendering transistors 630–660 conductive. Thus, the drain of the enabling transistor 600 is precharged low.

During the evaluation phase, the enable transistor 600 becomes conductive. The sources of the data transistors 630, 640 and the reference transistors 650, 660 are charge under the influence of the evaluation potential. In the reference circuit 620, the $R_2$ signal begins to transition toward the evaluation potential, rendering the second reference transistor 660 increasingly less conductive. However, because the $R_1$ signal remains at the precharge potential, the first reference transistor 350 remains strongly conductive. The $OUT_N$ output terminal 570 begins to charge under the influence of the evaluation potential $V_{cc}$.

In the evaluation circuit 610, the data signal $D_N$ may or may not evaluate depending upon its information content. If the data signal $D_N$ does not evaluate, it remains at the precharge potential and both data transistors 630, 640 remain strongly conductive. In this event, the $OUT_N\#$ output terminal 560 begins to charge under the influence of the evaluation potential via both data transistors 630, 640. If the data signal $D_N$ does evaluate, both data transistors 630, 640 become increasingly less conductive and the $OUT_N\#$ output terminal 260 charges only partially under the influence of the evaluation potential.

As in the embodiment of FIG. 2, during the evaluation phase, the two data transistors 630, 640 of the sense amplifier 500 operate in unison; they either remain conductive or become non-conductive as dictated by the value of the data signal $D_N$. By contrast, the reference transistors 650, 660 of the reference circuit 620 never operate in unison; one transistor 650 always remains conductive and the other transistor 660 always becomes non-conductive during the evaluation phase. According to an embodiment of the present invention, this difference in operation achieves timing differences in the signals generated on the output terminals 560, 570. If the data signal evaluates, the $OUT_N$ output terminal 570 charges faster than the $OUT_N\#$ output terminal 560; if not, the $OUT_N$ output terminal 570 charges more slowly than the $OUT_N\#$ output terminal 560.

At the beginning of the evaluation phase, the two clamping transistors 670, 680 are non-conductive. As an output terminal (say, $OUT_N\#$ terminal 560) charges, however, the clamping transistor 680 associated with the other output terminal 570 becomes increasingly more conductive, permitting any charge developed at the other output terminal 570 to discharge. Thus, as a first output terminal 560 evaluates, it tends to prevent the other output terminal 570 from evaluating.

Eventually, during the evaluation phase, the charging effect of one of the output terminals 560 or 570 becomes dominant. One of the output terminals 560 evaluates and the other terminal 570 is prevented from evaluating.

According to an embodiment of the invention, the data transistors 630, 640 and the reference transistors 650, 660 of the sense amplifier 500 may be weighted devices. A first transistor 630, 650 in the evaluation circuit 610 and the reference circuit 620 may have a first weight (labeled $W_1$) and a second transistor 640, 660 of the respective circuits 610, 620 may have a second weight (labeled $W_2$). As has been discussed above, the relative difference in weights affects the rates at which output terminals 560, 570 may charge. According to an embodiment, weight $W_2$ is selected to provide a relatively slower charging path than $W_1$. In such an embodiment, if the data signal $D_N$ were to evaluate, the $OUT_N\#$ output terminal 560 would charge primarily through transistor 640 (a $W_1$ transistor) while the $OUT_N$ output terminal 570 would charge through transistor 660 (a slower $W_2$ transistor). The $OUT_N\#$ output terminal 560 quickly becomes dominant in this event and prevents the $OUT_N$ output terminal 570 from evaluating. Alternatively, if the data signal $D_N$ does not evaluate, the $OUT_N\#$ output terminal 260 would not discharge at all and the $OUT_N$ terminal 570 would charge through transistor 360.

As noted above, embodiments of the sense amplifier 500 may provide an evaluation circuit 610 and a reference circuit 620 that are mutually symmetrical. Design symmetry in this embodiment also alleviates difficulties in manufacture of integrated circuits based on weighted transistors because it becomes necessary to control relative differences in weights rather than absolute magnitudes of weights.

Returning to FIG. 1, it should be appreciated that the wires 150, 160 for the reference signals, according to an embodiment of the present invention, will extend along the integrated circuit through much the same path as the wires 110–140 for the LVS data signals $D_1$–$D_N$. Doing so provides a level of noise immunity to the communication bus. As is known, wires of internal communication buses are subject to random noise that can affect the instantaneous potential of the wires. Often, the noise effects are localized. For example, a noise event that occurs on a first communication bus in a integrated circuit may not occur on a second communication bus provided at a physically remote portion of the same integrated circuit. By extending the wires 150, 160 of the reference signals through the same physical path as the remaining wires 110–140 of the communication bus, it improves the likelihood that noise events that affect any one wire of the bus will affect them all. Because the sense amplifiers 200 or 300 sense differences in potentials, this design helps to prevent the amplifiers from sensing potential differences that induced by noise. Thus, the design of the communication bus 100 contributes to noise immunity of the LVS signals.

Figure 4:
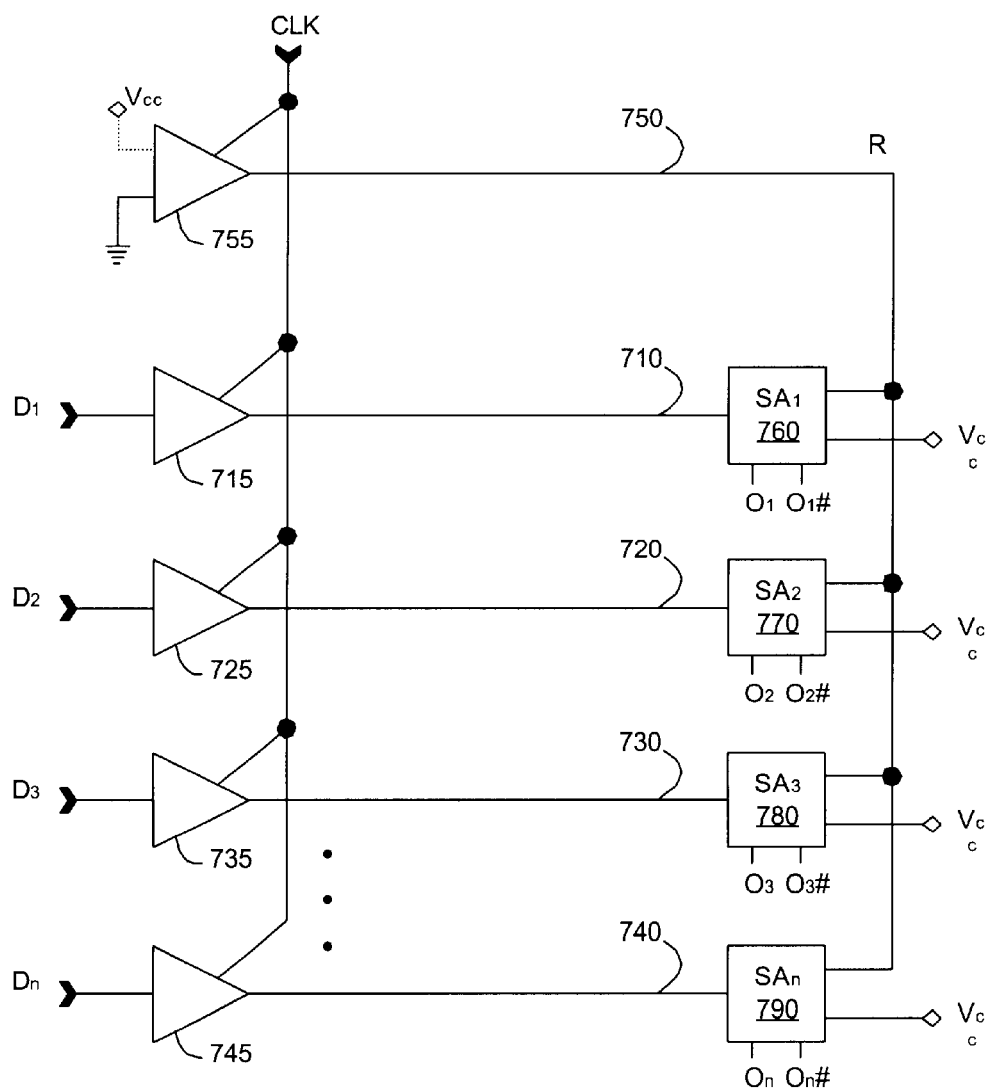
FIG. 4 is a block diagram illustrating a communication bus according to another embodiment of the present invention.

According to another embodiment of the present invention, shown in FIG. 4, a communication bus 700 for LVS signals may include as few as one wire for a reference signal R. The bus 700, as illustrated, includes a wire 710–740 for each of the LVS data signals $D_1$–$D_N$ and an additional wire 750 for the reference signal R. In this embodiment, there is no wire for a second reference signal as is illustrated in FIG. 1. The data wires 710–740 originate in respective line drivers 715–745 and terminate in respective sense amplifiers 760–790. The sense amplifiers 760–790 may be constructed in accordance with the embodiments described above with respect to FIGS. 2 and 3.

The reference wire 750 originates in a respective driver 755 and is distributed to all of the sense amplifiers 760–790. An input for the reference driver 755 may be coupled to the evaluation potential. In a "precharge high, evaluate low" embodiment, the reference driver input may be coupled to ground. In a "precharge low, evaluate high" embodiment, the reference driver may be coupled to $V_{cc}$ (illustrated in phantom in FIG. 4).

According to an embodiment of the present invention, the sense amplifiers 200 (FIG. 2) and 500 (FIG. 3) may be adapted for use with the embodiment of FIG. 4 by coupling the $R_1$ input to the precharge potential. As has been described, the $R_1$ input never evaluates, it is maintained at the precharge potential during the precharge phase and the evaluation phase of the data signals. Accordingly, input terminals for the $R_1$ reference signal may be coupled directly to the precharge potential. In the embodiment of FIG. 2, the input terminal 220 may be coupled to $V_{cc}$. In the embodiment of FIG. 3, the input terminal 520 may be coupled ground.

The embodiment of FIG. 4, while it permits a communication bus 700 to include fewer wires than would be found in an embodiment such as is provided by the communication bus 100 of FIG. 1, would not provide the noise immunity as is noted above with respect to FIG. 1. As is known, the power distribution circuits for $V_{cc}$ and ground need not traverse the same path as would a communication path. Accordingly, localized noise events at the communication bus may not induce the same effects in the precharge potential or the evaluation potential. Accordingly, those who are designing communication buses for integrated circuits necessarily will balance the consideration of reducing the number of metal tracks with the interest in providing enhanced noise immunity when selecting among the embodiments disclosed herein.

Several embodiments of the present invention are specifically illustrated and described herein. However, it will be appreciated that modifications and variations of the present invention are covered by the above teachings and within the purview of the appended claims without departing from the spirit and intended scope of the invention.

I claim:

1. A communication bus system for a predetermined number of low voltage swing data signals, comprising:

a single data wire for each bit of data, first and second reference wires for respective first and second reference signals, extending through a common spatial path as the data wires;

a sense amplifier coupled to each data wire, at least one sense amplifier comprising:

a pair of output terminals, an evaluation circuit connecting a first output terminal to an evaluation potential and having an input terminal coupled to the respective data wire, a reference circuit connecting a second output terminal to the evaluation potential and having input terminals coupled respectively to the first and second reference wires, and a pair of clamping circuits, each coupling a respective one of the output terminals to a precharge potential and having an input coupled to the other of the output terminals.

2. The communications bus system of claim 1, wherein the evaluation circuit and the reference circuit are mutually symmetrical.

3. The communications bus system of claim 1, wherein the evaluation circuit comprises a pair of data transistors, each coupling an output terminal to the evaluation potential across a source to drain path and having a gate coupled to the data input terminal.

4. The communications bus system of claim 1, wherein the reference circuit comprises a pair of transistors, each coupling an output terminal to the evaluation potential across a source to drain path,
   wherein the first transistor has a gate coupled to the input terminal of the first reference signal, and
   wherein the second transistor has a gate coupled to the input terminal of the second reference signal.

5. The communications bus system of claim 1, wherein:
   the evaluation circuit comprises a pair of data transistors, each coupling an output terminal to the evaluation potential across a source to drain path and having a gate coupled to the data input terminal;
   the reference circuit comprises a pair of reference transistors, each coupling an output terminal to the evaluation potential across a source to drain path, the first reference transistor having a gate coupled to the input terminal of the first reference signal and the second reference transistor having a gate coupled to the input terminal of the second reference signal,
   wherein the first data transistor and the first reference transistor have substantially similar weights.

6. The communications bus system of claim 1, wherein each clamping circuit comprises a transistor connecting a respective output terminal to the precharge a potential across a source to drain path and having a gate connected to the other output terminal.

7. A communication bus system for a predetermined number of low voltage swing data signals, comprising:
   a single data wire for each bit of data;
   a sense amplifier coupled to each data wire, at least one sense amplifier comprising:
      a pair of output terminals,
      an evaluation circuit connecting a first output terminal to an evaluation potential, having at least a fast evaluation path,
      a reference circuit connecting a second output terminal to the evaluation potential and having at least a slow evaluation path, and
      a pair of clamping circuits, each coupling a respective one of the output terminals to a precharge potential and having an input coupled to the other of the output terminals; and
   first and second reference wires for respective first and second reference signals, the first and second reference wires input to each of the sense amplifiers.

8. The communications bus system of claim 7, wherein the evaluation circuit and the reference circuit are mutually symmetrical.

9. The communications bus system of claim 7, wherein the evaluation circuit comprises a pair of data transistors, each coupling an output terminal to the evaluation potential across a source to drain path and having a gate coupled to a data signal source.

10. The communications bus system of claim 7, wherein the reference circuit comprises a pair of transistors, each coupling an output terminal to the evaluation potential across a source to drain path,
   wherein the first transistor has a gate coupled to a first reference signal source, and
   wherein the second transistor has a gate coupled to a second reference signal source.

11. The communications bus system of claim 7, wherein:
   the evaluation circuit comprises a pair of data transistors, each coupling an output terminal to the evaluation potential across a source to drain path and having a gate coupled to a data signal source;
   the reference circuit comprises a pair of reference transistors, each coupling an output terminal to the evaluation potential across a source to drain path, the first reference transistor having a gate coupled to a first reference signal source and the second reference transistor having a gate coupled to a first reference signal source,
   wherein the first data transistor and the first reference transistor have substantially similar weights.

12. The communications bus system of claim 7, wherein each clamping circuit comprises a transistor connecting a respective output terminal to the precharge potential across a source to drain path and having a gate connected to the other output terminal.

13. A communication bus system for a predetermined number of low voltage swing data signals, comprising:
   a single data wire for each bit of data;
   a sense amplifier coupled to each data wire;
   a reference wire for a reference signal input to each of the sense amplifiers extending through a common spatial path as the data wires;
   wherein at least one sense amplifier comprises:
      a pair of output terminals,
      an evaluation circuit connecting a first output terminal to an evaluation potential and having an input terminal coupled to the respective data wire,
      a reference circuit connecting a second output terminal to the evaluation potential and having an input terminal coupled to the reference wire, and
      a pair of clamping circuits, each coupling a respective one of the output terminals to a precharge potential and having an input coupled to the other of the output terminals.

14. The communications bus system of claim 13, wherein the evaluation circuit and the reference circuit are mutually symmetrical.

15. The communications bus system of claim 13, wherein the evaluation circuit comprises a pair of data transistors, each coupling an output terminal to the evaluation potential across a source to drain path and having a gate coupled to the data input terminal.

16. The communications bus system of claim 13, wherein the reference circuit comprises a pair of transistors, each coupling an output terminal to the evaluation potential across a source to drain path,
   wherein the first transistor has a gate coupled to the input terminal of the reference signal, and
   wherein the second transistor has a gate coupled to the precharge potential.

17. The communications bus system of claim 13, wherein:
   the evaluation circuit comprises a pair of data transistors, each coupling an output terminal to the evaluation potential across a source to drain path and having a gate coupled to the data input terminal;
   the reference circuit comprises a pair of reference transistors, each coupling an output terminal to the evaluation potential across a source to drain path, the first reference transistor having a gate coupled to the input terminal of the reference signal and the second reference transistor having a gate coupled to the precharge potential, wherein the first data transistor and the first reference transistor have substantially similar weights.

18. The communications bus system of claim 13, wherein each clamping circuit comprises a transistor connecting a respective output terminal to the precharge potential across a source to drain path and having a gate connected to the other output terminal.

19. A communication bus system for a predetermined number of low voltage swing data signals, comprising:

a single data wire for each bit of data;

a sense amplifier coupled to each data wire;

a reference wire for a reference signal input to each of the sense amplifiers, the reference wire extending through a common spatial path as the data wires;

wherein at least one sense amplifier comprises:

a pair of output terminals, an evaluation circuit connecting a first output terminal to an evaluation potential, having at least a fast evaluation path, a reference circuit connecting a second output terminal to the evaluation potential and having at least a slow evaluation path, and a pair of clamping circuits, each coupling a respective one of the output terminals to a precharge potential and having an input coupled to the other of the output terminals.

20. The communications bus system of claim 19, wherein the evaluation circuit and the reference circuit are mutually symmetrical.

21. The communications bus system of claim 19, wherein the evaluation circuit comprises a pair of data transistors, each coupling an output terminal to the evaluation potential across a source to drain path and having a gate coupled to a data signal source.

22. The communications bus system of claim 19, wherein the reference circuit comprises a pair of transistors, each coupling an output terminal to the evaluation potential across a source to drain path, wherein the first transistor has a gate coupled to the wire of the reference signal, and wherein the second transistor has a gate coupled to the precharge potential.

23. The communications bus system of claim 19, wherein:

the evaluation circuit comprises a pair of data transistors, each coupling an output terminal to the evaluation potential across a source to drain path and having a gate coupled to a data signal source;

the reference circuit comprises a pair of reference transistors, each coupling an output terminal to the evaluation potential across a source to drain path, the first reference transistor having a gate coupled to the wire of the reference signal, and the second reference transistor having a gate coupled to the precharge potential;

wherein the first data transistor and the first reference transistor have substantially similar weights.

24. The communications bus system of claim 19, wherein each clamping circuit comprises a transistor connecting a respective output terminal to the precharge potential across a source to drain path and having a gate connected to the other output terminal.

25. A communication bus for low voltage swing data signals having a data width D, comprising D+2 wires allocated as a wire for each of the D bits of data and a pair of wires for respective dummy reference signals, the bus terminating in a plurality of sense amplifiers, each provided on a respective data wire and coupled to each of the wires for the reference signals.

26. The communication bus of claim 25, wherein each sense amplifier is to capture information from the respective data wire by a differential comparison of a potential on the data wire and potentials on the wires for the reference signals.

27. The communication bus of claim 25, wherein potentials on the data wires during a precharge phase of a governing clock are set at a precharge potential and the potentials on the data wires during an evaluation phase of the governing clock transition toward an evaluation potential depending upon information content of a respective data signal.

28. The communication bus of claim 27, wherein a potential of one of the reference signals is maintained constantly at the evaluation potential and a potential of the other of the reference signals is maintained constantly at the precharge potential.

29. The communication bus of claim 25, wherein the wires for the data signals and the reference signals all extend through a common spatial path.

30. A communication bus for low voltage swing data signals having a predetermined data width D, comprising D+1 wires allocated as a wire for each bit of data and a wire for a dummy reference signal, the bus terminating in a plurality of sense amplifiers, one provided for each data wire and coupled to the wire for the reference signal.

31. The communication bus of claim 30, wherein each sense amplifier is to capture information from the respective data wire by a differential comparison of a potential on the data wire and potentials on the wire for the reference signal.

32. The communication bus of claim 30, wherein potentials on the data wires during a precharge phase of a governing clock are set at a precharge potential and the potentials on the data wires during an evaluation phase of the governing clock transition toward an evaluation potential depending upon information content of a respective data signal.

33. The communication bus of claim 32, wherein a potential of the reference signal is maintained constantly at the evaluation potential.

34. The communication bus of claim 30, wherein the wires for the data signals and the reference signal all extend through a common spatial path.

35. A communication bus for low voltage swing data signals having a data width D, consisting essentially of D+2 wires, of which D wires are allocated to carry data and a pair of wires are allocated for respective dummy reference signals against which the data of the D wires are to be compared.

36. The communication bus of claim 35, wherein the first dummy reference signal is to be maintained constantly at an evaluation potential and the second dummy reference signal is to be maintained constantly at a precharge potential during operation.

37. The communication bus of claim 35, wherein the wires for the data signals and the reference signals all extend through a common spatial path.

38. The communication bus of claim 25, wherein the D+2 wires are members of the bus.

39. The communication bus of claim 25, wherein the bus extends from a source circuit that generates the signals on the D+2 wires to a destination circuit that comprises the sense amplifiers.

40. The communication bus of claim 30, wherein the D+2 wires are members of the bus.

41. The communication bus of claim 30, wherein the bus extends from a source circuit that generates the signals on the D+2 wires to a destination circuit that comprises the sense amplifiers.

42. Apparatus comprising a bus extending from a source circuit to a destination circuit, the bus comprising D+2 wires to carry D bits of data in low voltage swing signals, the remaining two wires to carry dummy signals at respective reference potentials.

43. The communication bus of claim 42, wherein the D+2 wires extend through a common spatial path.

44. The communication bus of claim 42, wherein destination circuit comprises a plurality of sense amplifiers, one sense amplifier for each of the D bits of data, to capture information from a corresponding data wire by a differential comparison of a potential on the data wire and potentials on the wires for the reference signals.

45. The communication bus of claim 42, wherein the source circuit is to set potentials on the D data wires to a precharge potential during a precharge phase of a governing clock and to set the potentials on the D data wires transition toward an evaluation potential depending upon information content of a respective data signal.

46. The communication bus of claim 45, wherein a potential of one of the reference signals is maintained constantly at the evaluation potential and a potential of the other of the reference signals is maintained constantly at the precharge potential.

47. Apparatus, comprising a bus extending from a source circuit to a destination circuit, the bus comprising D+1 wires to carry D bits of data in low voltage swing signals, the remaining wires to a carry dummy signal at a reference potential.

48. The communication bus of claim 47, wherein the D+1 wires extend through a common spatial path.

49. The communication bus of claim 47, wherein destination circuit comprises a plurality of sense amplifiers, one sense amplifier for each of the D bits of data, to capture information from a corresponding data wire by a differential comparison of a potential on the data wire and the reference potentials on the $D+1^{st}$ wire.

50. The communication bus of claim 47, wherein the source circuit is to set potentials on the D data wires to a precharge potential during a precharge phase of a governing clock and to set the potentials on the D data wires transition toward an evaluation potential depending upon information content of a respective data signal.

51. The communication bus of claim 50, wherein a potential of one of the reference signals is maintained constantly at the evaluation potential and a potential of the other of the reference signals is maintained constantly at the precharge potential.

* * * * *